United States Patent
Lee et al.

(10) Patent No.: US 6,724,682 B2
(45) Date of Patent: Apr. 20, 2004

(54) NONVOLATILE SEMICONDUCTOR MEMORY DEVICE HAVING SELECTIVE MULTIPLE-SPEED OPERATION MODE

(75) Inventors: June Lee, Seoul (KR); Heung-Soo Im, Kyonggi-do (KR); Sun-Mi Choi, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/150,387

(22) Filed: May 17, 2002

(65) Prior Publication Data

US 2002/0181315 A1 Dec. 5, 2002

(30) Foreign Application Priority Data

Jun. 1, 2001 (KR) .......................... 2001-30750

(51) Int. Cl.[7] .................................. G11C 8/00
(52) U.S. Cl. ................... 365/230.06; 365/235
(58) Field of Search .................... 365/230.06, 235, 365/185.18

(56) References Cited

U.S. PATENT DOCUMENTS 6,097,666 A * 8/2000 Sakui et al. ........... 365/230.06
6,400,603 B1 * 6/2002 Blyth et al. ............ 365/185.12
6,510,081 B2 * 1/2003 Blyth et al. ............ 365/185.12

OTHER PUBLICATIONS

M. Momodomi, et al. "New Device Technologies for 5v–Only 4mb EEPROM with NAND Structure Cell" IEDM published 1998.

* cited by examiner

*Primary Examiner*—Michael Tran
(74) *Attorney, Agent, or Firm*—Marger Johnson & McCollom, P.C.

(57) ABSTRACT

Disclosed is a nonvolatile semiconductor memory device having selective multiple-speed operation modes selected by simple options. The nonvolatile semiconductor memory device includes a memory cell array formed of a plurality of cell array blocks each having a plurality of cell strings, the cell string formed with floating gate memory cell transistors such that their control gates each are respectively connected to a plurality of word lines, and its drain-source channels are series connected to each other between a string select transistor and a ground select transistor. The memory device also includes a multiple-speed mode option part for generating a multiple-speed option signal, and an addressing circuit for selecting a page size and block size of the memory cell array different from one another in response to a state of the multiple-speed option signal.

20 Claims, 9 Drawing Sheets

NONVOLATILE SEMICONDUCTOR MEMORY DEVICE HAVING SELECTIVE MULTIPLE-SPEED OPERATION MODE

CROSS REFERENCE TO RELATED APPLICATIONS

This application claims priority from Korean Priority Document No. 2001-30750, filed on Jun. 1, 2001, which is hereby incorporated by reference in its entirety.

BACKGROUND OF THE INVENTION

1. Field of the Invention

This disclosure relates to an electrically programmable and erasable nonvolatile semiconductor memory device and, more particularly, to a nonvolatile semiconductor memory device having selective multiple-speed operation modes.

2. Description of the Related Art

Semiconductor memory devices are generally classified into two groups, that is, volatile semiconductor memory devices and non-volatile semiconductor memory devices. The volatile semiconductor memory devices are further classified into a dynamic random access memory and a static random access memory. The volatile semiconductor memory devices have rapid read and write speeds. However, if the volatile semiconductor memory devices are not continuously supplied with external electric power, data stored in the memory cells are eliminated.

Non-volatile semiconductor memory devices are classified into a mask read only memory (MROM), a programmable read only memory (PROM), an erasable and programmable read only memory (EPROM), and an electrically erasable programmable read only memory (EEPROM).

Even though the non-volatile semiconductor memory devices are not supplied with an external electric power, the devices permanently maintain data stored in memory cells and are accordingly used in storing data to be stored regardless of supply of an electric power. However, a user cannot freely write (or program) and read with an electronic system itself provided therein with the MROM, PROM, and EPROM. That is, it is not easy for a user to erase or reprogram the already programmed data once it is mounted on a board.

However, since the EEPROM can be used in a system in which erasing and writing are electrically performed, it is on an increasing trend that the EEPROM is applied to a supplementary memory device or a system-program storage device that continuously requires renewal of data. That is, various electronic devices that are controlled by recent computers or microprocessors more and more require development in EEPROMs that can be erased and programmed often. Furthermore, since using a hard disk device having a rotational magnetic disk as a supplementary memory device occupies a comparatively large space in a potable computer or battery powered computer such as a notebook computer, computer designers are turning their interest to developing EEPROMs that occupy a small space. That is, designers are interested in a high concentrated and high performance EEPROM.

In order to achieve a highly concentrated EEPROM, there is a problem that the space occupied by memory cells in the EEPROM should be reduced. To solve the problem, EEPROM memory cells having a NAND structure were developed by which the number of contact holes between bit-lines and the number of selection transistors per cell can be reduced. Such a NAND structure cell is disclosed for instance, on pages 412 to 415 of IEDM published in 1988, under the title of "NEW DEVICE TECHNOLOGIES FOR 5V—ONLY 4 Mb EEPROM WITH NAND STRUCTURE CELL", the contents of which are herein incorporated in their entirety.

As EEPROM design techniques have continuously been improved, a NAND type flash EEPROM having a flash erase function has appeared. Since the NAND type flash EEPROM can be easily integrated and made at a low cost relative to the NOR type or AND types of EEPROMs, it is advantageous to apply the NAND type flash EEPROM it to a large scaled supplementary memory device. Recent markets require various NAND-type flash memories and accordingly, various functional options need to be provided at the design time of the NAND type flash memory to comply with the various requirements.

The cell array structure of the NAND type flash memory having characteristics described above will be explained below.

Figure 10:
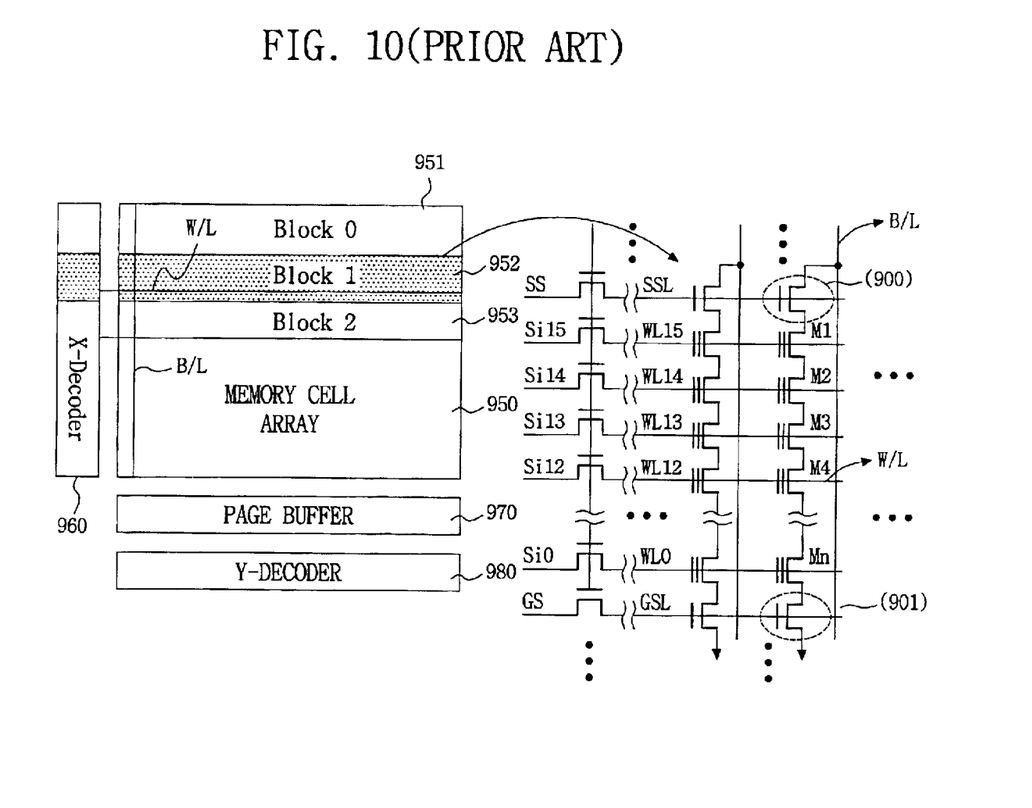
FIG. 10 is a view illustrating the cell array structure and NAND type flash cell strings of the conventional NAND type flash EEPROM.

FIG. 10 illustrates the cell array structure of the typical NAND type flash EEPROM and the NAND type flash cell strings.

As shown in the left side of the drawing, the NAND flash memory device includes a memory cell array 950, a row decoder 960 for receiving input addresses and selecting a word line W/L, a page buffer 970 connected to each of bit lines B/L to input/output data to the selected memory cell, and a column decoder 980 for column decoding.

The memory cell array 950 includes a plurality of cell array blocks 951, 952, 953 having a plurality of cell strings. That is, the memory cell array 950 is formed of a plurality of block units, and one block comprises a plurality of memory cell transistors formed of cell strings, for instance, memory cell transistors of 4 Kbyte unit. Referring to the right side of the drawing, it shows a plurality of cell strings in the cell array block.

The basic unit of the NAND type flash memory cell array is cell string (sometimes called a "NAND cell unit"). One cell array block includes a first select transistor 900 connected to a corresponding bit line at its drain through a contact hole, a second select transistor 901 connected to a common source line GSL at its source, and a plurality of cell strings formed with n memory transistors M1, M2, . . . , Mn that have drain-source channels series connected between the source of the first select transistor and the drain of the second select transistor. The first select transistor 900 serves to connect or disconnect a selected cell string with bit line B/L, and the second select transistor 901 is used as a ground path of cell string. The NAND type cell string is typically formed on a P type semiconductor substrate, and each of the memory cell transistors has a floating gate formed on a gate oxide film at a channel region between its source and drain regions and a control gate formed on the floating gate. A plurality of word lines W/L are arranged at a first direction, a horizontal direction for instance, to select memory cell transistors M1, M2, . . . , Mn having floating gates in the cell strings and a plurality of bit lines B/L are arranged at a direction perpendicular to the first direction, a vertical direction for instance. The WLs are electrically connected to control gates of the memory cell transistors, and practically play the role of the control gate.

In order to program the memory transistor selected in the cell string, all memories of transistors in the cell string are erased at once, and a programming operation is performed. Such a simultaneous erasing operation of all the memories (commonly known as a flash erase) can be performed by supplying 0 Volts to all the control gates and 20 Volts to the P type well region and the N type substrate, so that the selected memory transistor is programmed by Fowler-Nordheim tunneling (F-N tunneling) through holes from the drain to the floating gate. Thereby electrons are uniformly discharged from the floating gates of the memory transistors to the P type well. As a result, the threshold voltage of each of the memory transistors becomes a negative voltage of approximately −4V and the transistor is in a state of depletion by which a binary logic "1" is considered stored.

In order to program the selected memory transistor in the NAND cell unit, 20V is applied to a gate of the first select transistor and a control gate of the selected memory transistor, 0V is applied to a gate of the second select transistor, and a middle voltage of 7V is applied to a control gate of each of the non-selected memory transistors.

If the selected memory transistor is written or programmed by a binary logic "0", 0V is applied to bit-lines connected to the NAND cell unit and electrons are accordingly implanted onto a floating gate of the selected memory transistor, thereby the transistor is changed into an enhancement mode. In contrast, if the selected memory transistor is programmed by a binary logic "1", a middle voltage of 7V that corresponds to a program preventing voltage is applied to the corresponding bit-lines, thereby preventing the program operation in the selected memory transistor.

In such a manner, the selected memory transistors are programmed by F-N tunneling of holes from the drain of the transistor to floating gate.

In the memory cell array structure of the NAND flash memory as described above, the memory cell transistors connected to a common word line at their control gates are called pages, and a plurality of pages that are connected to a same string line SSL are called a block.

Generally, data read and program operations are performed by a page unit and erase operation is performed by a block unit.

The size of the page and the size of the block are predetermined when the hardware of the flash memory is designed. Unlike the NOR type flash memory that can be read by random access of byte (x8) unit or word (x16) unit, the NAND type flash memory detects data by a page unit during a relatively long time (~10 us) to thereby store the data in the page buffer. The controller connected to the flash memory, CPU for instance, toggles a read enable pin (nREx pin) of the flash memory to thereby patch data stored in the page buffer. In such a way, the flash memory requires a relatively long latency for a read operation, however thereafter, quickly inputs/outputs data stored in the page buffer, thereby having a relatively excellent overall data in/out rate. In the case of the flash memory, the larger the size of the page, the more the data in/out rate increases. However, the size of the page cannot be enlarged to an infinite magnitude in order to increase the data in/out rate. The reason is that if the page size is enlarged, the block size that is a basic unit during erasing operation is also enlarged thereby causing any inconvenience in rewriting a relatively small unit of data.

Accordingly, if a user wishes to rewrite a relatively large scaled data and requires a high data output rate, he should use a flash memory having a large page and large block. If a user wishes to rewrite a relatively small-scaled data, he should use a flash memory having a small sized block. In the case of the flash memory that the page size and the block size are physically determined when its design completes, there is a problem that it takes a lot of time and costs a great deal to design and manufacture separate products in compliance with a user's requirements to various sizes.

Therefore, an improved technique that satisfies various sizes in the devices without designing and manufacturing separate products whenever a user requires products of various sizes is desired.

SUMMARY OF THE INVENTION

Embodiments of the present invention provide a NAND type flash memory device that can properly operate in response to a user's requirements to page sizes and block sizes, and have various multiple speeds of operation mode according to options.

Some embodiments of the present invention provide the structure and operation method of a NAND type flash memory device having two or more page sizes and block sizes.

Some devices according to embodiments of the invention include:
  a memory cell array formed of a plurality of cell array blocks each having a plurality of cell strings;
  a multiple-speed mode option part for generating a multiple-speed option signal, and
  an addressing circuit for selecting different page sizes and block sizes of the memory cell array in response to a state of the multiple-speed option signal.

BRIEF DESCRIPTION OF DRAWINGS

The advantages of the present invention will become apparent by describing in detail preferred embodiments thereof with reference to the attached drawings in which.

DETAILED DESCRIPTION OF THE PREFERRED EMBODIMENTS

Hereinafter, embodiments of the present invention will be described in detail with reference to the accompanying drawings. It should be noted that like reference numerals are used through the accompanying drawings for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures to clarify key points of the present invention.

In a 64 M Bit memory cell array, if a standard speed operation mode uses a array including 1024 cell array blocks having a page size of 512+16=528 bytes and a block size of 8 K bytes, then in order to increase an input/output rate to a double-speed operation mode, 512 cell array blocks having a page size of 1024+31=1056 bytes and a block size of 16 K need to be used. If a user wants to rewrite relatively-large-scaled data at a high data-output rate, a double-speed operation mode would be beneficial. If a user wants to rewrite relatively-small-scaled data, the standard speed operation mode is sufficient. The double-speed operation mode or, two or more multiple-speed operation modes have a merit in that data input/output rates increase as much as the corresponding multiple speeds. At the same time, it has a disadvantage in that the lifetime of the memory cells decrease due to increase in the number of repeated programming operations.

If a user designs and fabricates a flash memory having a desired multiple speed operation mode with a memory cell array having a fixed capacity whenever various multiple-speed operation modes are required, it is clear that design and fabrication costs increase, and accordingly product costs increase. Therefore, it is desirable that a flash memory that operates at any selected multiple speed operation mode by controlling an option device provided therein be fabricated.

Figure 1:
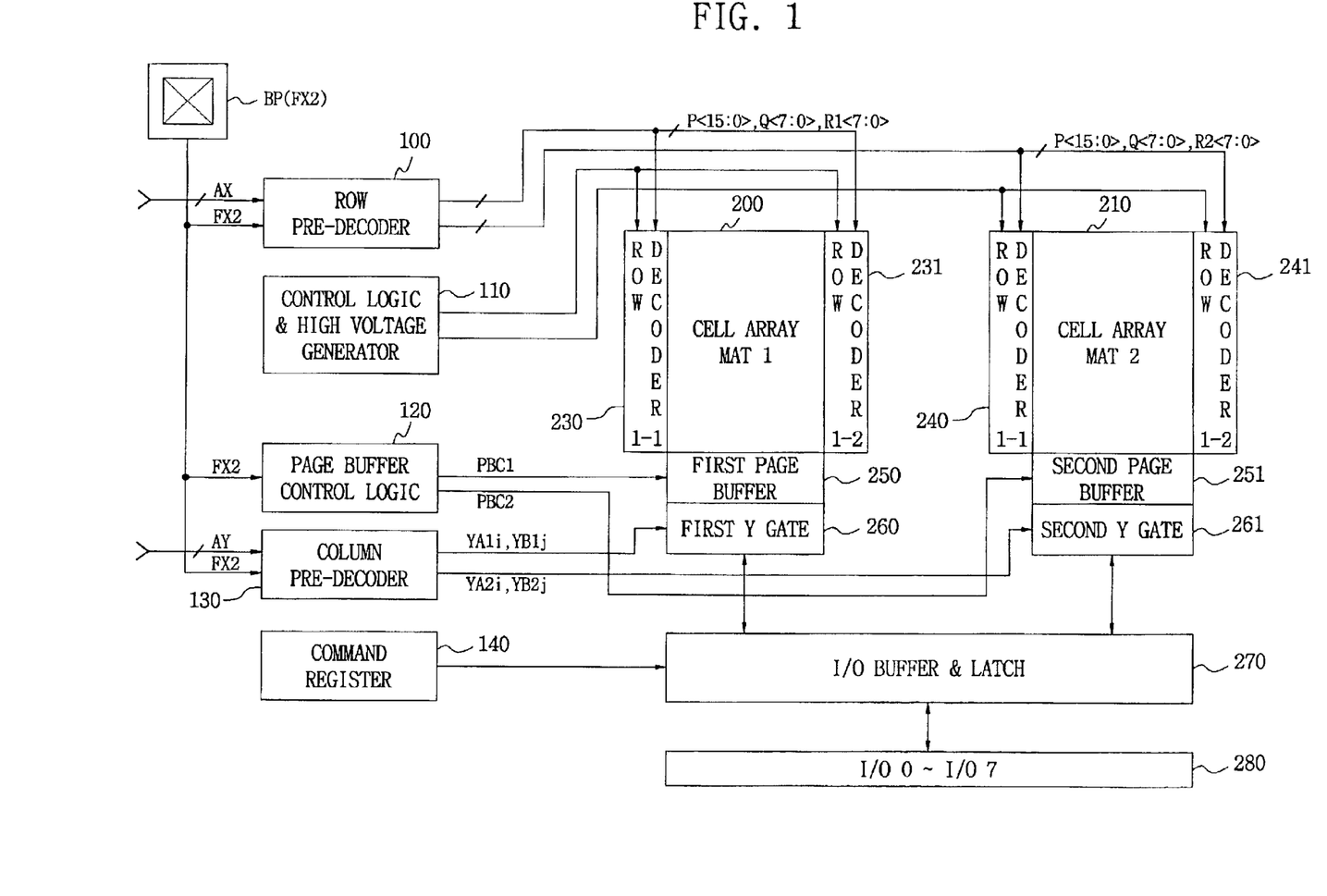
FIG. 1 is a block diagram illustrating a nonvolatile semiconductor memory device having a selective multiple-speed operation mode according to an embodiment of the present invention.

FIG. 1 is a block diagram illustrating a nonvolatile semiconductor memory device having a selective multiple-speed operation mode according to an embodiment of the present invention. Referring to the drawing, the nonvolatile semiconductor memory device includes cell arrays 200, 210 forming a memory cell array; row decoders 230, 231, 240, 241 for receiving row pre-decoding signals to select word lines of the cell arrays 200, 210; first and second page buffers 250, 251 connected to the bit line of the cell arrays 200, 201 to input/output data to/from a selected memory cell transistor; first and second Y gates 260, 262 for selecting the first and second page buffers 250, 251 in response to the column pre-decoding signals; an I/O buffer and latch 270 connected to the first and second Y gates 260, 262 to buffer and latch input/output data; an input/output port 280 connected to the I/O buffer and latch 270 to input/output data; a row pre-decoder 100 for pre-decoding a multiple-speed option signal and an input row address to thereafter input the row pre-decoding signals to the row pre-decoders 230, 231, 240, 241; a control logic and high voltage generator 110 for controlling the row decoders 230, 231, 240, 241 and applying a high voltage; a page buffer control logic 120 for controlling the first and second page buffers 250, 251 in response to the multiple speed option signal; a column pre-decoder 130 for pre-decoding the multiple speed option signal and input column address to thereafter input the column pre-decoding signal to the first and second Y gates 260, 261; and a command register 140 connected to the I/O buffer and latch 270 to thereby apply a command.

FIG. 1 shows only two cell array blocks 200, 201 forming a memory cell array, for convenience' sake. However, it should be noted that a practical memory device may have a plurality of cell array blocks.

Hereinafter, the cell array block 200 will be referred to as MAT 1 and the other cell array block 210 will be referred to as MAT 2. The MAT 1 and MAT 2 200, 210 are different from one another only in their addresses, but same in the structure. If a memory performing reading and programming operations by a unit of 512 bytes with a page buffer of 512 bytes is referred to as a single-speed flash memory, the NAND type flash memory having a page buffer of 1 K bytes accordingly becomes a double-speed flash memory and the NAND type flash memory having a page buffer of 2 K bytes becomes a quad-speed flash memory. In an embodiment of the present invention, for convenience's sake, a flash memory device having single-speed/double-speed options only will be described below.

The MATs 1, 2 (200, 210) each shown in FIG. 1 may have the following array structure.

One NAND type cell string is in series connected to 16 memory cell transistors. One page buffer is connected to one corresponding bit line. A main field of one MAT comprises bit lines of 512 bytes, and a spare field comprises bit lines of 16 bytes. Accordingly, the page size in one MAT is 512+16=528 bytes and supports reading and programming operations at a single-multiple-speed. In addition, since one block includes 16 pages that are in series connected to each other, the minimum unit (block size) is (8 k+256) bytes per one MAT. Each of the MATs includes 512 blocks along a vertical axis (y axis), and input/output of data are performed by a unit of byte. The spare field belongs to an extra array region being used in storing error/correction codes ECC, or block information. The term "main field" is only used to make a distinction from the term "spare field".

Now, the number of addresses that are necessary in the single-speed reading and programming operation modes will be explained as follows. Since one page should be selected out of the 16 pages after one block is selected out of the 512 blocks, in order to select one word line in one mat, the number of row addresses becomes 9+4=13. Where, if an address for selecting blocks is added, the necessary total number of row addresses becomes 14. Meanwhile, since the column addresses are accessed by one byte out of a total of 512 bytes, 9 addresses are necessary. Particularly, if one spare enable address for data input/output in the spare field side is added, a total of 10 column addresses are required in one mat.

As described above, in order that a device having the block size of 8 K bytes for supporting single-speed reading, programming and erasing operations in each of the MATs is used as a device having the block size of 16 K bytes to perform double-speed reading, programming and erasing operations according to options, an option device for making a distinction between the single-speed and double-speed operations is required. Such an option device can be used with a metal option, a fuse option, or a bonding option, for instance. In the embodiment of the present invention, as shown in FIG. 1, the bonding pad (BP) is used as an option device. In the case of two kinds of multiple-speed modes, the multiple-speed option signal FX2 that appears from the bonding pad BP has a low level of signal or a high level of signal. The multiple-speed option signal FX can be created by, for instance, the option information output circuit as shown in FIG. 3.

Figure 3:
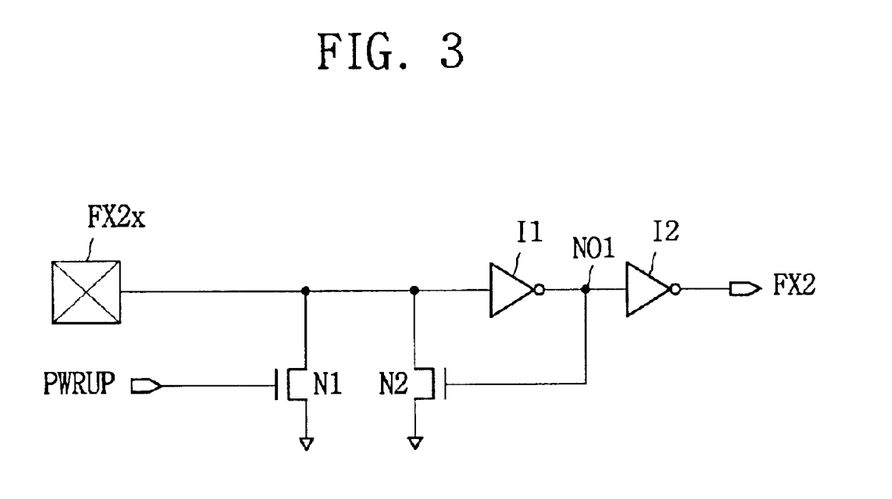
FIG. 3 is a circuit diagram showing an option data output circuit connected to the bonding pad of FIG. 1 for generating a multiple-speed option signal.

FIG. 3 is a circuit diagram of an option information output circuit connected to the bonding pad of FIG. 1 for generating a multiple-speed option signal. The option information output circuit includes an inverter I1 connected to the bonding pad BP (FX2x in FIG. 3) at its input terminal, an inverter I2 for inverting output of the inverter I1, an N type MOS transistor N1 having a drain-source channel connected between the input terminal of the inverter I1 and ground and receiving a power-up signal PWRUP at its gate, and an N type MOS transistor N2 having a drain-source channel connected between the input terminal of the inverter I1 and ground and receiving an output of the inverter I1 at its gate.

In FIG. 3, after the bonding pad BP is first formed, if the bonding pad is connected to a power voltage, the pad of VCC for instance, by a wire bonding process, the output signal, e.g., the multiple-speed option signal FX2 is activated to a logic "HIGH", thereby allowing the device to operate according to the double-speed option. If the pad FX2x is connected to ground voltage or allowed to float, the multiple-speed option signal FX2 is disabled to a logic "LOW" after powering-up, thereby allowing the device to perform the single-speed operation as a default option.

Meanwhile, in order to operate the memory cell array having a predetermined capacity with double-speed operation mode, the page size and block size that are set at a single-speed operation mode should be doubled. Accordingly, the double-speed operation mode requires one additional column address than the single-speed operation mode.

In this embodiment; taking into account such a feature, the row address AX<9> that is used as a MAT select address at a 1-multiple-speed operation mode will be changed to a column address to thereafter be used. The newly added column address should be controlled to be output from a column address counter that applies the column address to the column pre-decoder 130. Therefore, the column address counter must operate as a 10-antilogarithm counter for the single-speed mode and then as an 11-antilogarithm counter for the double-speed mode.

Figure 4:
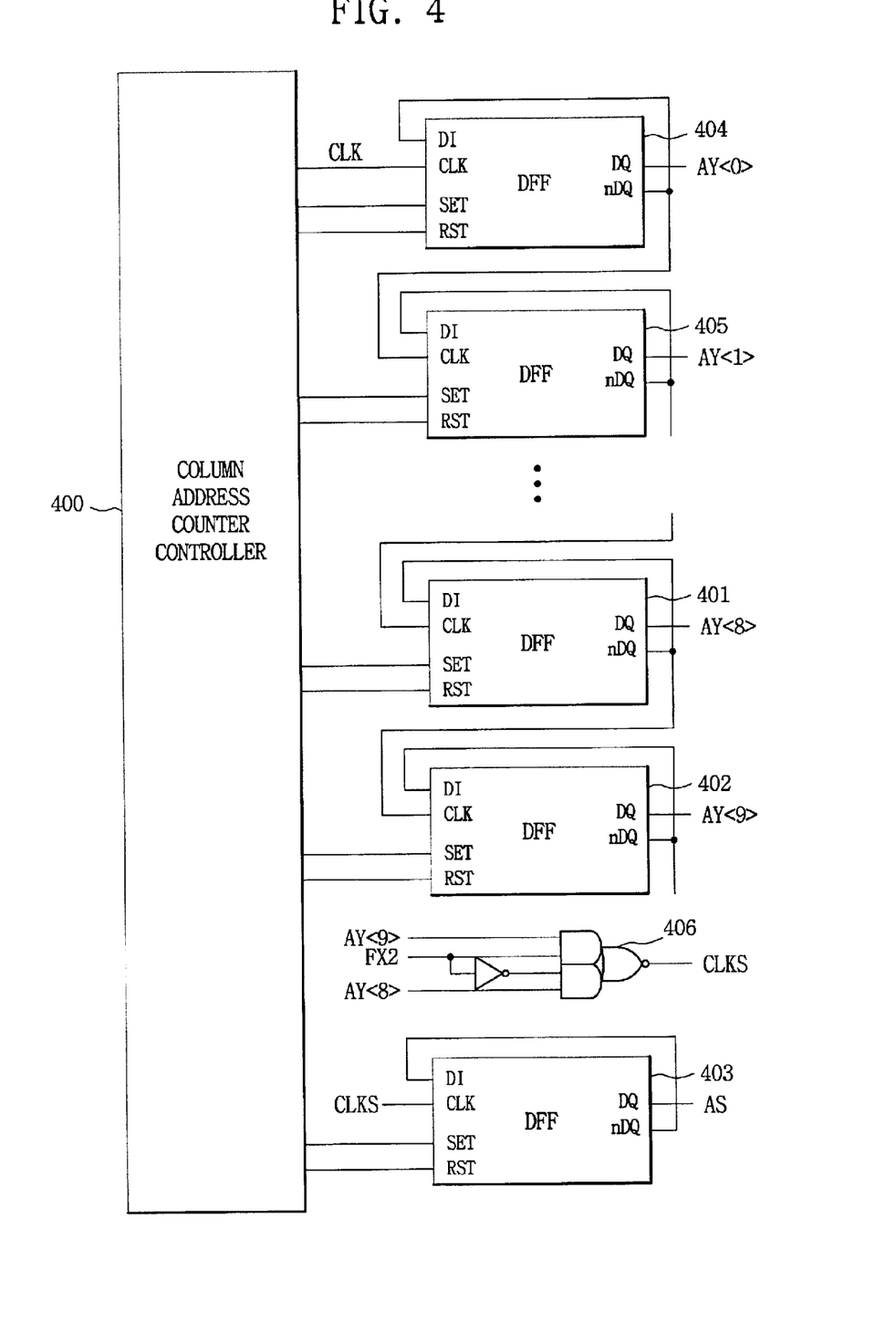
FIG. 4 is a block diagram of the column address counter that is connected to the column pre-decoder of FIG. 1 and optionally controlled.

FIG. 4 is a block diagram showing the structure of the column address counter that performs different counting operations according to multiple-speed operation modes.

Referring to FIG. 4, it is noted that the column address counter is connected to the column pre-decoder and option-controlled, and the column address counter controller 400 is connected to a plurality of D type flip-flops 401–405 and the signal selector 406. The column address counter sequentially increases addresses from a start address in response to a clock signal CLK during serial data input/output to a selected page. After counting to a final column of the main field, the column address counter generates a spare field enable signal AS, thereby allowing data to continuously be input/output to the spare field. Prior to performing a counting operation at the spare field, the double-speed operation mode allows an additional counting operation to be performed once more through the newly added D flip-flop 402. In the case of the single-speed operation, the counting operation through the D flip-flop 402 is skipped, and the carrier of the flip-flop 401 should be connected to the data input terminal DI of the D flip-flop 403 for enabling the spare field. For these, the signal selector 406 generates an output signal CLKS. That is, the signal selector 406 transfers the carry of the D flip-flop 402 or the carry of the D flip-flop 401 to the D flip-flop 403 in response to a logic state of the multiple-speed option signal FX2. The column address counter controller 400 serves to control setting an initial address such as clocking of the column address counter and resetting.

Figure 5:
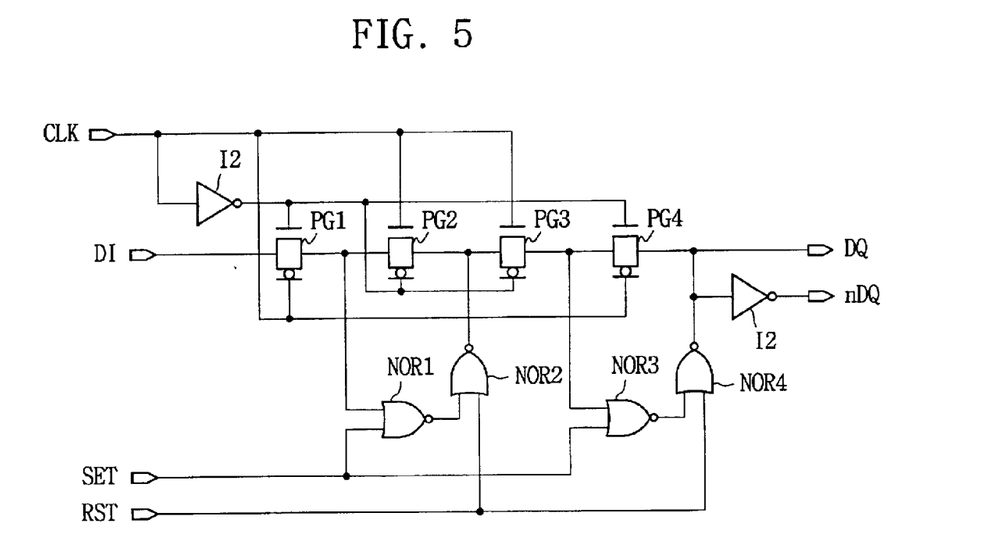
FIG. 5 is a detailed view showing one of the D flip-flops shown in FIG. 4.

FIG. 5 is a detailed view showing one of the D flip-flops shown in FIG. 4. Referring to FIG. 5, the D flip-flop includes an inverter I2 for inverting a clock signal CLK, a plurality of transmission gates PG1,PG2,PG3,PG4 for transmitting an input signal DI to an output terminal in response to the clock signal CLK, NOR gates NOR1,NOR2,NOR3,NOR4 for receiving a set signal SET and a reset signal RST at their respective input terminal, and an inverter I2 for inverting the output.

Figure 6:
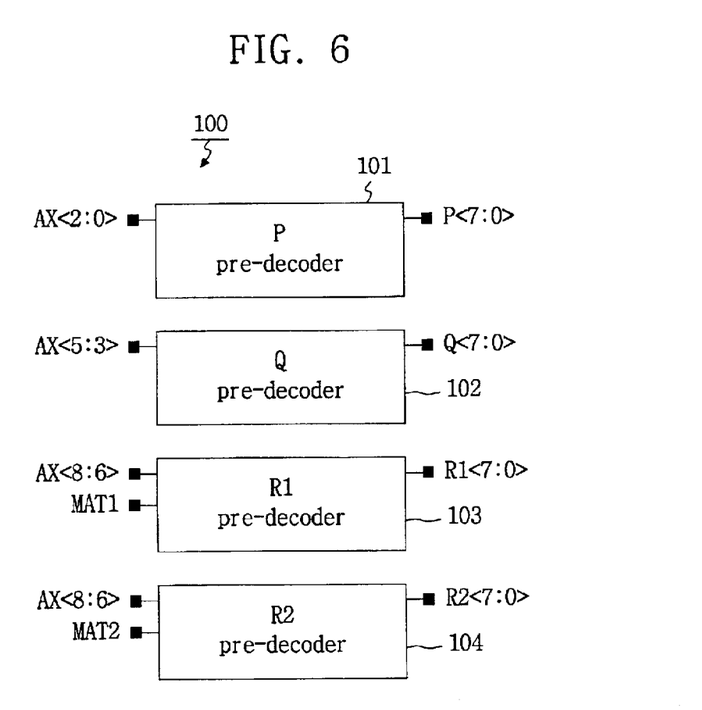
FIG. 6 is a detailed block diagram of the row pre-decoder shown in FIG. 1.

To perform the double-speed operation, the decoding operation of the row pre-decoder 100 should be changed. Generally, 9 addresses are used to decode one out of a total of 512 bocks in one MAT. In this embodiment, 4 pre-decoders as shown in FIG. 6 are formed to reduce the number of the decoding signal bus lines, and each of the pre-decoders has 3 addresses. The P, Q pre-decoders 101, 102 are commonly used for the MAT1 and MAT2, the R1, R2 pre-decoders 103, 104 each serve to control the MAT 1 and MAT 2. That is, unlike the P, Q pre-decoders 101, 102, the R1, R2 pre-decoders 103, 104 are controlled by the MAT select addresses.

Figure 7:
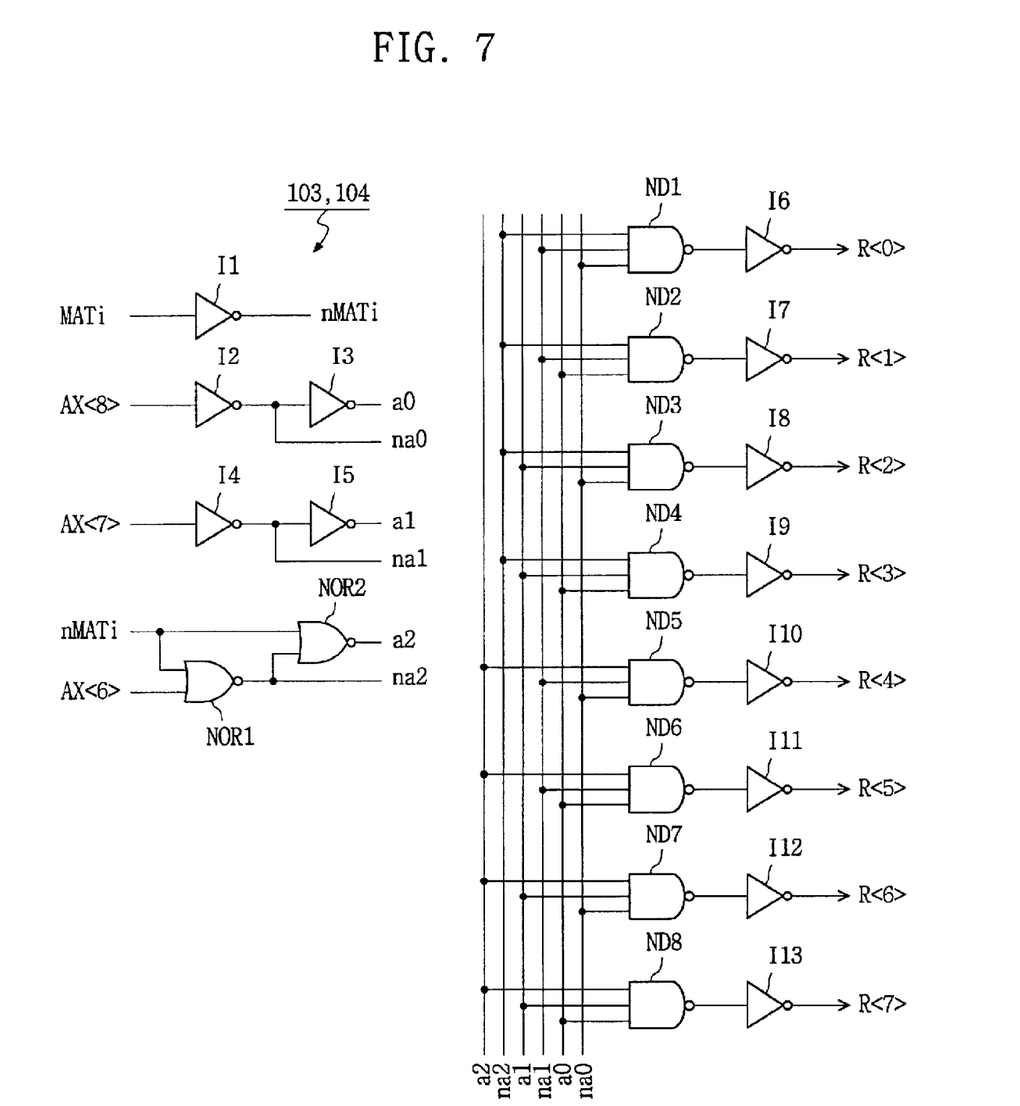
FIG. 7 is a detailed block diagram of the R pre-decoder shown in FIG. 6.

FIG. 7 shows a detailed circuit view of the R pre-decoders 103, 104. Since the output signals of the R pre-decoders that are responsive to a non-selected MAT are all disabled during a single-speed operation, only one block is selected by a decoding operation of the P, Q, R in a selected MAT. Since the block size at a double-speed operation mode must increase from 8 K bytes to 16 K bytes on the basis of the main field, blocks of 8 K byte each are selected in the respective MATs by decoding of the P, Q, R, thereby the selected blocks become a total of 16 K bytes in size. The MAT select address has been used as a column address only during the double-speed operation, the MAT select signals MAT1, MAT 2 for controlling the R pre-decoder are enabled to a solid "HIGH" at a double-speed operation mode.

Figure 8:
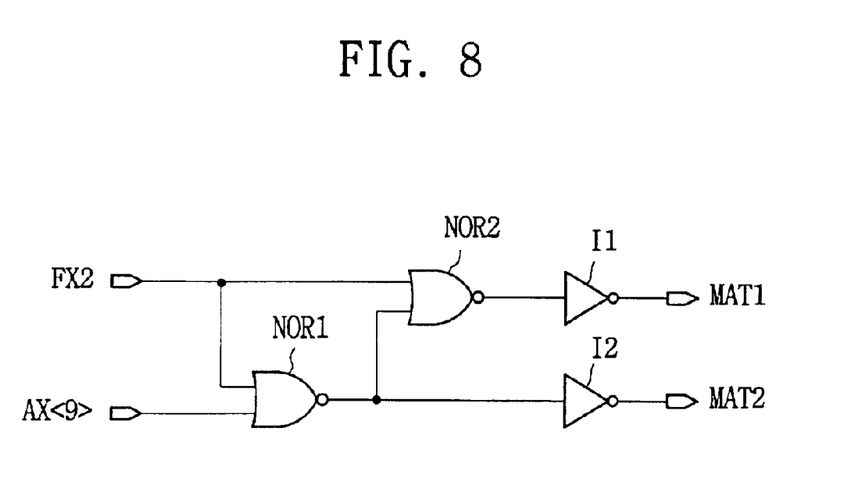
FIG. 8 is a MAT select address generating circuit that is included in the row pre-decoder shown in FIG. 1.

FIG. 8 shows a MAT select signal decoding part for decoding a MAT select signal at a single-speed operation mode and at a double-speed operation mode. The MAT select signal decoding part for decoding the multiple-speed option signal and the MAT select address signal to generate the decoding MAt select address signal includes first and second NOR gates NOR1, NOR2 and inverters I1, I2 for inverting the outputs of the first and second NOR gates NOR1, NOR2. In the case that the FX2 signal is enabled to "HIGH" to support the double-speed operation, the decoding MAT select address signals MAT1, MAT2 become a solid "HIGH". In case that the FX2 signal is disabled to "LOW" to support the single-speed operation, only one out of the decoding MAT select address signals MAT1, MAT2 is selected by the MAT select address AX<9>. The MAT select signal decoding part is related to FIG. 5.

As a result, since one row address is used only as a column address to perform a double-speed operation, it is assumed that the number of row addresses becomes 13 at a double-speed operation mode, which is one less than at a single-speed operation mode, and the number of column addresses becomes 11 (including the spare enable address), which is increased one more than at a single-speed operation mode. Accordingly, the addressing operation is performed in such a manner that the page and block sizes of the memory cell array increase more than two times, thereby reading, writing, and erasing operations are performed at multiple-speed modes.

Figure 9:
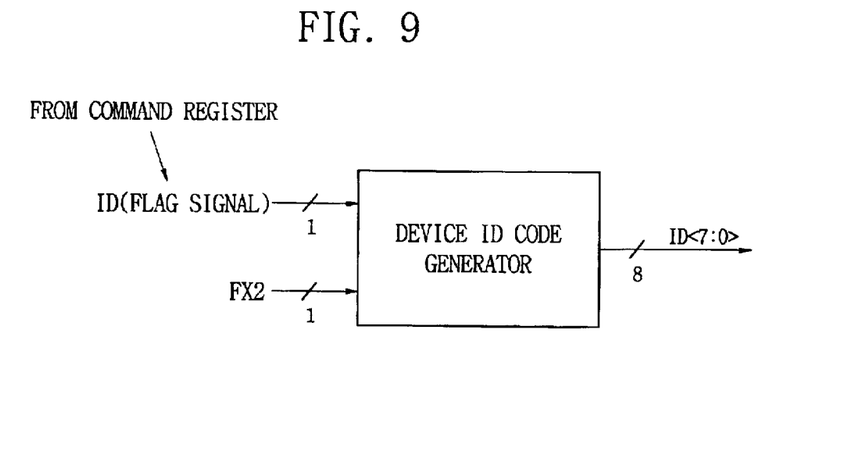
FIG. 9 is a block diagram of a Device ID generator that is coupled to the command register according to embodiments of the invention.

FIG. 9 shows a code generator that generates an 8-bit device ID (ID<7:0>) when an appropriate signal is received from the command register 140, and based on the state of the multi-speed option signal (FX2). In a NOR type flash memory, the device ID is output during an auto-select mode. In a NAND type flash device, the device ID is output by a read enable pin toggle after a command for outputting the device ID is input. Of course, the device ID itself varies with the multi-speed options.

Figure 2A:
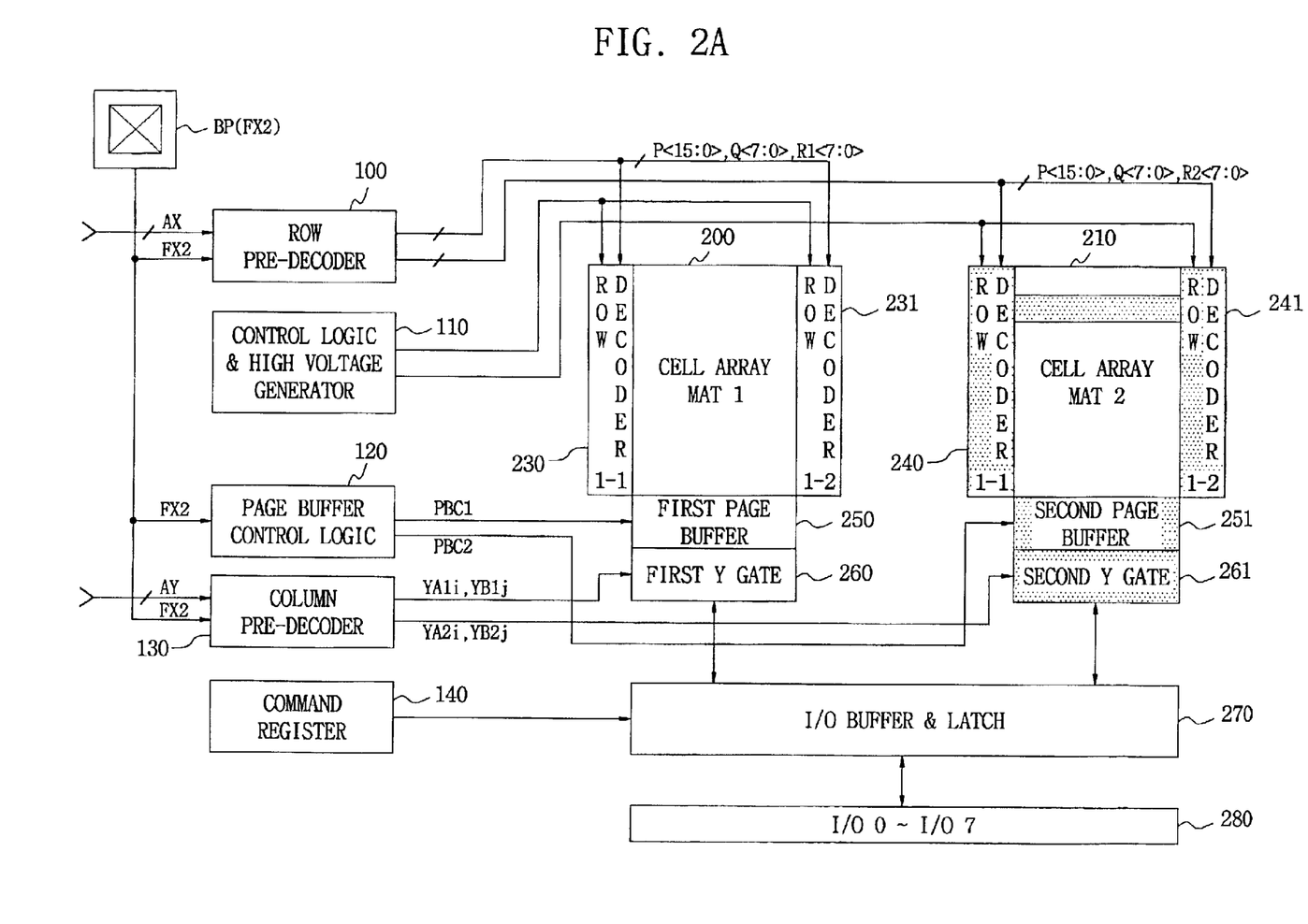
FIG. 2A is a block diagram illustrating the cell array access of the device as shown in FIG. 1 according a single speed option.

Hereinafter, the single-speed option and double-speed option operations will be explained according to the structure as described above. Referring to FIG. 2A showing the cell array block access of the device shown in FIG. 1, when the bonding pad BP is connected to ground or floating, the multiple-speed option signal FX2 is disabled to "LOW", thereby setting a single-speed operation option. If the page size is 528 bytes and block size is 8K bytes in 64 M bit, only the MAT 2 out of the MAT select signals MAT 1 and MAT2 in FIG. 8 becomes a level of "HIGH" by the MAT select address AX<9>. The row pre-decoder 100 pre-decodes 14 input row address signals to select one block of the MAT 2 210 shown in FIG. 2A. The column address counter shown in FIG. 4 operates as a 10-antilogarithm counter to generate 10 column addresses. The column pre-decoder 130 inputs the column pre-decoding signal to the second Y gate 261 so that the gate 261 can perform the decoding operation. Accordingly, at a default operation mode, i.e., single-speed option mode, the page size of 528 bytes and the block size of 8 K bytes are selected, thereby a read or program operation is performed by a page unit and an erase operation is performed by a block unit.

Figure 2B:
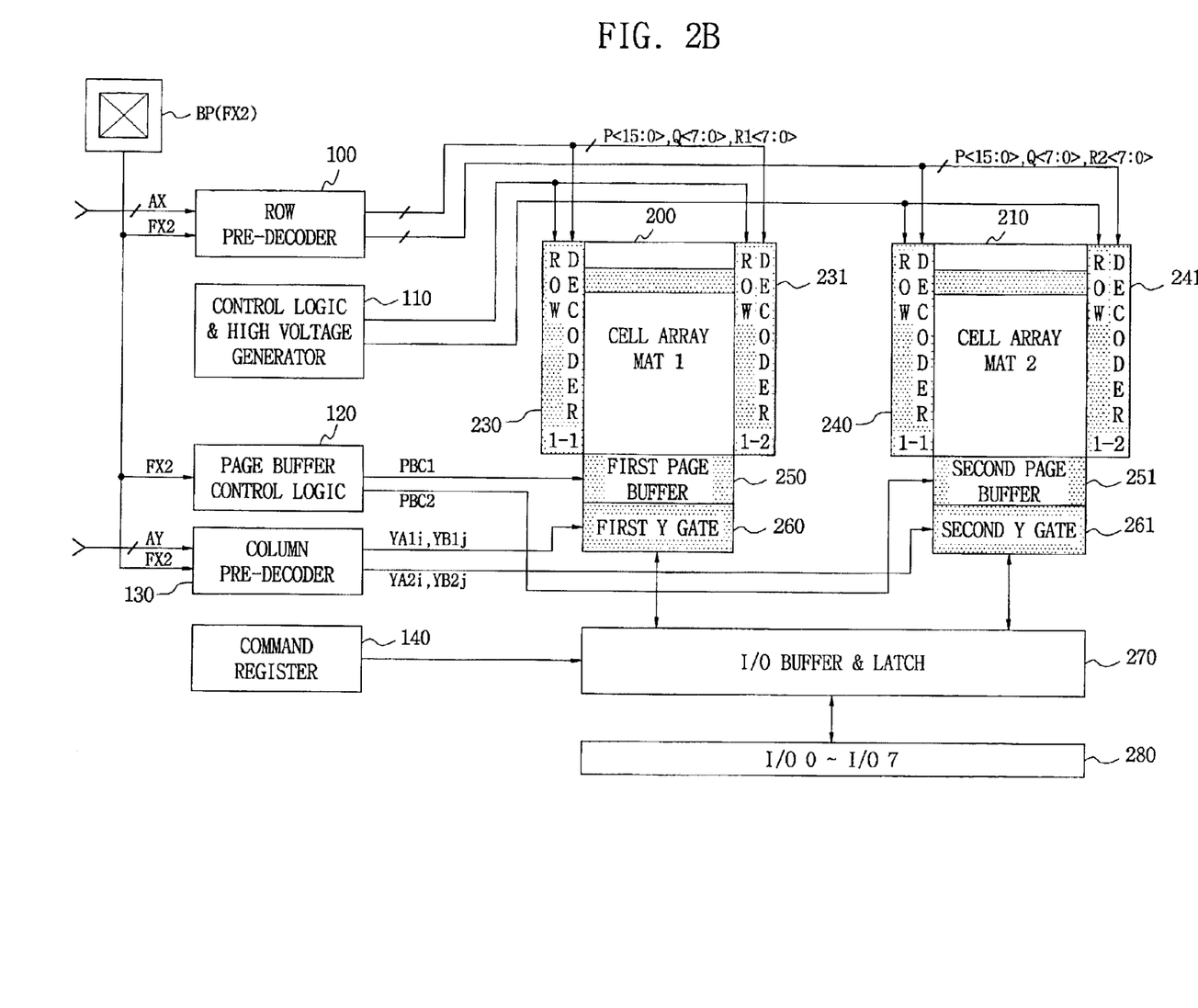
FIG. 2B is a block diagram illustrating the cell array access of the device as shown in FIG. 1 according to a double speed option.

Referring to FIG. 2B showing the cell array block access of the device shown in FIG. 1 according to the double-speed option, when the bonding pad BP is connected to power voltage, i.e., the pad of VCC by wire-bonding, e.g., the multiple-speed option signal FX2 is activated to "HIGH", thereby setting the double-speed operation option. In this case, the row pre-decoder 100 pre-decodes 13 input row address signals to select one block of the MAT 1 200 and one block of the MAT 2 210 shown in FIG. 2B. The column address counter shown in FIG. 4 operates as an 11-antilogarithm counter to generate 11 column addresses. The column pre-decoder 130 inputs the column pre-decoding signal to the first and second Y gates 260, 261 so that the gates 260, 261 can perform a decoding operation. Accordingly, at a double-speed option mode, the page size of 1056 bytes and the block size of 16 K bytes are selected, thereby a read or program operation is performed by a page unit of 1056 bytes and an erase operation is performed by a block unit of 16 K bytes.

As described above, the present invention satisfies users' requirements with the aforementioned two modes without a need to develop additional products.

The explanations as described above are as examples limited to the preferred embodiments accompanying drawings, but it should be noted that the present invention can be modified and changed within the sprit and scope of the present invention. For example, in addition to the options for the single-speed and double-multiple-speed operation modes, various options such as double-speed and quad-multiple-speed operation modes can be added to the present invention by extending the concepts taught herein.

In addition, other memories such as NOR type or AND type can be also implemented with multiple-speed operation modes by using the bonding or other option. The logic gates shown in the detailed views can be also replaced with other equivalent circuits or other logic devices.

What is claimed is:

1. A nonvolatile semiconductor memory device comprising:
    a memory cell array formed of a plurality of cell array blocks each having a plurality of cell strings, each cell string formed with floating gate memory cell transistors having control gates respectively connected to a plurality of word lines, and wherein drain-source channels of the memory cell transistors are connected in series to each other between a string select transistor and a ground select transistor;
    a multiple-speed mode selector for generating a multiple-speed option signal; and
    an addressing circuit for selecting a different page size and block size of the memory cell array in response to a state of the multiple-speed option signal.

2. The memory device as claimed in claim 1, wherein the multiple-speed mode selector comprises a bonding pad that is selectively connected to power voltage.

3. The memory device as claimed in claim 1, wherein the multiple-speed mode selector is formed of a fuse or metal that can be cut.

4. The memory device as claimed in claim 1, wherein the addressing circuit comprises:
    a row decoder for decoding a mat select address signal out of input row address signals in response to the multiple-speed option signal, and receiving the decoded mat select address signals and input row address signals to thereby generate row decoding signals for selecting, during a multiple-speed mode operation, a page size more than two times a page size of a default mode operation;
    a column address counter for generating column address signals that allow an antilogarithm counting operation to perform differently in response to a state of the multiple-speed signal; and
    a column decoder for decoding column address signals input from the column address counter to thereby generate column decoding signals for selecting during the multiple-speed mode operation a block size more than two times the block size of the default mode operation.

5. The memory device as claimed in claim 4, wherein the row decoder comprises:
    a mat select signal decoder for decoding the multiple-speed option signal and the mat select address signal to thereby generate decoding mat select address signals;
    a P pre-decoder for pre-decoding first group addresses out of the input row address signals;
    a Q pre-decoder for pre-decoding second group addresses that are at a higher level than the first group addresses out of the input row address signals; and
    R1 and R2 pre-decoders for pre-decoding third group addresses that are at a higher level than the second group addresses out of the input row address signals in response to the decoding mat select address signals.

6. The memory device as claimed in claim 4, wherein the column address counter is connected to a column address counter controller through a plurality of D type flip-flops and a signal selector, and operates as a 10-antilogarithm counter or 11-antilogarithm counter in response to a state of the multiple-speed option signal.

7. The memory device as claimed in claim 1, further comprising an output circuit for outputting a device identification signal in response to a state of the multi-speed option signal.

8. A nonvolatile semiconductor memory device comprising:
    a memory cell array formed of a plurality of cell array blocks each having a plurality of cell strings, each cell string formed with floating gate memory cell transistors having control gates respectively connected to a plurality of word lines, and wherein drain-source channels of the memory cell transistors are connected in series to each other between a string select transistor and a ground select transistor;

a multiple-speed mode option part for generating a multiple-speed option signal;

a row decoder for decoding a mat select address signal out of input row address signals in response to the multiple-speed option signal, and receiving the decoded mat select address signals and input row address signals to thereby generate row decoding signals for selecting during a multiple-speed mode operation a page size more than two times the page size of a default mode operation;

a column address counter for generating column address signals that allow an antilogarithm counting operation to perform differently in response to a state of the multiple-speed signal; and a column decoder for decoding column address signals output from the column address counter to thereby generate column decoding signals for selecting during the multiple-speed mode operation a block size more than two times the block size of the default mode operation; and a page buffer controller for controlling operations of page buffers corresponding to the page and block sizes in response to a state of the multiple-speed signal.

9. The memory device as claimed in claim 8, wherein the column address decoder performs a decoding operation by adding and subtracting column addresses in response to a state of the multiple-speed option signal.

10. The memory device as claimed in claim 8, wherein the row address decoder performs a decoding operation by adding and subtracting row addresses in response to a state of the multiple-speed option signal.

11. A method of driving a nonvolatile semiconductor memory device comprising a memory cell array formed of a plurality of cell array blocks each having a plurality of cell strings that are formed of floating gate memory cell transistors having control gates respectively connected to a plurality of word lines, and having drain-source channels that are series connected to each other between a string select transistor and a ground select transistor, the method comprising:

forming a multiple-speed option part for generating a multiple-speed option signal according to a device option in the device; and performing addressing to enlarge page and block sizes of the memory cell array by more than two times in response to a state of the multiple-speed option signal, enabling reading, writing and erasing to be performed at a multiple-speed mode operation.

12. A semiconductor memory device having flash memory cells, comprising an address counter, a column decoder, and a row decoder that are option-controlled so that block and page sizes predetermined at a hardware design can be changed according to a device option.

13. A non-volatile memory device, comprising:

a memory cell array formed of a plurality of cell array blocks each having a plurality of cell strings;

a multiple-speed mode selector for generating a multiple-speed option signal, the multiple-speed option signal having at least a first state and a second state; and an address circuit structured to generate a first page size and block size for the memory cell array in response to the first state of the multiple-speed option signal, and structured to generate a second page size and block size for the memory cell array in response to the second state of the multiple-speed option signal.

14. The memory device according to claim 13, wherein the multiple-speed mode selector comprises a bonding pad that is adapted to be coupled to a power voltage.

15. The memory device according to claim 13, further comprising an output circuit for outputting a device identification signal in response to a state of the multi-speed option signal.

16. A method for operating a memory device, comprising:

generating a multiple-speed signal;

sensing a state of the multiple-speed signal at an addressing circuit coupled to a memory array in the memory device; and changing page and block sizes of the memory cell array in response to the state of the multiple-speed option signal.

17. The method according to claim 16, wherein generating a multiple-speed signal comprises coupling a multiple-speed signal generating circuit to a power voltage.

18. The method according to claim 16 wherein sensing a state of the multiple-speed signal at an addressing circuit comprises sensing a state of the multiple-speed signal at a row pre-decoding circuit an at a column pre-decoding circuit.

19. The method according to claim 16, wherein changing page and block sizes of the memory cell array comprises operating a column address counter as a 10-antilogarthim counter when it senses a first state of the multiple-speed signal, and operating a column address counter as an 11-antilogarithm counter when it senses a second state of the multiple-speed signal.

20. The method according to claim 16, further comprising outputting a device identification signal in response to a state of the multi-speed option signal.

* * * * *